United States Patent
Wang et al.

(10) Patent No.: US 9,637,837 B2
(45) Date of Patent: May 2, 2017

(54) SOLUTION-BASED SYNTHESIS OF DOPED ZNO NANOSTRUCTURES

(71) Applicant: WISCONSIN ALUMNI RESEARCH FOUNDATION, Madison, WI (US)

(72) Inventors: Xudong Wang, Madison, WI (US); Fei Wang, Madison, WI (US); Alexander V. Kvit, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 757 days.

(21) Appl. No.: 13/968,356

(22) Filed: Aug. 15, 2013

(65) Prior Publication Data
US 2015/0047555 A1    Feb. 19, 2015

(51) Int. Cl.
*C30B 7/14* (2006.01)
*C30B 29/16* (2006.01)
*C30B 29/60* (2006.01)
*C30B 7/04* (2006.01)

(52) U.S. Cl.
CPC ............... *C30B 7/14* (2013.01); *C30B 29/16* (2013.01); *C30B 29/60* (2013.01); *C30B 7/04* (2013.01)

(58) Field of Classification Search
CPC ............ C30B 29/16; C30B 29/60; C30B 7/14
See application file for complete search history.

(56) References Cited

U.S. PATENT DOCUMENTS

2010/0263586 A1* 10/2010 Richardson ............. C30B 7/005
117/64
2011/0309354 A1* 12/2011 Wang ................. H01L 21/02472
257/43
2011/0311438 A1* 12/2011 Pachauri .............. B01J 19/0093
423/622

OTHER PUBLICATIONS

Fan et al., "Control of the doping concentration, morphology and optoelectronic properties of vertically aligned chlorine-doped ZnO nanowires," Acta Materialia 59 (2011) 6790-6800.*
Nadarajah, "Fundamental Properties of Funtional Zinc Oxide Nanowires Obtained by Electrochemical Method and Their Device Applications," Dissertations and Theses, Paper 633, 2012.*
Wang et al., "An aqueous solution-based doping strategy for large-scale synthesis of Sb-doped ZnO nanowires," Nanotechnology 22 (2011) 225602 (8pp).*
Ilican et al., "Structural, optical and electrical properties of F-doped ZnO nanorod semiconductor thin films deposited by sol-gel process," Applied Surface Science 255 (2008) 2353-2359.*
Yankovich et al., Stable p-Type Conduction from Sb-Decorated Head-to-Head Basal Plane Inversion Domain Boundaries in ZnO Nanowires, Nano Letters, vol. 12, Jan. 23, 2012, pp. 1311-1316.
Wang et al., An aqueous solution-based doping strategy for large-scale synthesis of Sb-doped ZnO nanowires, Nanotechnology, vol. 22, Apr. 1, 2011, pp. 1-8.

(Continued)

*Primary Examiner* — Michael Kornakov
*Assistant Examiner* — Hua Qi
(74) *Attorney, Agent, or Firm* — Bell & Manning, LLC (57) ABSTRACT

Methods of making electrically conductive, doped zinc oxide nanowires and nanowire films are provided. The methods comprises the steps of forming an aqueous solution comprising a dopant-containing precursor salt, a zinc-containing precursor salt and a pH buffering agent and heating the aqueous solution to a temperature below its boiling point in the presence of seed crystals, whereby doped zinc oxide nanowires are grown in situ from the seed crystals in the aqueous solution.

20 Claims, 13 Drawing Sheets

(56) References Cited

OTHER PUBLICATIONS

Cui et al., Low-Temperature Growth and Characterization of Ci-Doped ZnO Nanowire Arrays, J. Phys. Chem. C, vol. 112, Mar. 1, 2008, pp. 4475-4479.
Fan et al., Control of the doping concentration, morphology and optoelectronic properties of vertically aligned chlorine-doped ZnO nanowires, Acta Materialia, vol. 59, Aug. 9, 2011, pp. 6790-6800.

* cited by examiner

SOLUTION-BASED SYNTHESIS OF DOPED ZNO NANOSTRUCTURES

REFERENCE TO GOVERNMENT RIGHTS

This invention was made with government support under 0832760 awarded by the National Science Foundation. The government has certain rights in the invention.

BACKGROUND

Doping semiconductor nanowires (NWs) with impurity atoms is often an efficacious way of engineering their electrical and optical properties. For example, ZnO NWs can be doped to enhance their conductivity. Chloride-doped ZnO nanowires have been fabricated via electrochemical deposition. Unfortunately, electrochemical deposition intrinsically requires conductive substrates and, therefore, is not compatible with transparent conductor applications.

SUMMARY

Methods of making electrically conductive, doped zinc oxide nanowires and nanowire films are provided.

One method of making conductive, doped zinc oxide nanowires comprises: forming an aqueous solution comprising a chloride-containing or fluoride-containing precursor salt, a zinc-containing precursor salt and a buffering system; and heating the aqueous solution to a reaction temperature below its boiling point in the presence of a substrate comprising seed crystals, whereby chloride- or fluoride-doped zinc oxide nanowires are grown in situ from the seed crystals in the aqueous solution. The aqueous solution is buffered to pH in the range from about 5 to about 7 at the reaction by the buffering system, which comprises a pH buffering agent and, optionally, an acid. This method is not based on an electrochemical synthesis route and, therefore, can be used to grow the nanowires on a wide variety of substrates, including non-electrically conducting substrates.

In one specific embodiment of the method, aluminum chloride is employed as the chloride-containing precursor salt. Such embodiments can be used to provide chloride doped zinc oxide nanowires having a chloride dopant concentration of 1 atomic % or higher and that are free of aluminum dopants.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

DETAILED DESCRIPTION

Methods of making electrically conductive, doped zinc oxide nanowires and nanowire films comprising arrays of the nanowires are provided. The zinc oxide nanowires produced with the methods are characterized by metallic conductivity, optical transparency and low resistivity. As a result, they are well-suited for use in applications such as photovoltaic devices, photodetectors, light-emitting diodes, and piezoelectric nanogenerators.

The methods provide a simple, solution-based process for the synthesis of zinc oxide nanowires that can be carried out at low temperatures. Because the methods do not rely on electrochemical synthesis, they can be used to grow the nanowires on a variety of substrates, including non-electrically conductive substrates, electrically conductive substrates and semi-conductor substrates.

One embodiment of the present methods comprises the steps of forming an aqueous solution comprising a dopant-containing precursor salt, a zinc-containing precursor salt and a pH buffering agent and heating the aqueous solution, to a reaction temperature below its boiling point in the presence of seed crystals, whereby doped zinc oxide nanowires are grown in situ from the seed crystals in the aqueous solution. In this method, the pH buffering agent is used to maintain the pH of the aqueous solution in a pH range that allows for the precipitation of the precursor salts but also ensures the formation of nanostructures having a nanowire morphology. It has been discovered that this pH range is ideally from about 5 to about 7 at the reaction temperature. This includes embodiments in which the pH is in the range from about 5.3 to 6 at the reaction temperature and further includes embodiments in which the pH is in the range from about 5.5 to 5.7 at the reaction temperature.

The pH of the aqueous solution will depend on, and can be tailored by, the acidity of the dopant-containing precursor salts, the pH buffering agents and any additional acids used in the buffering system.

The dopant-confining precursor salts are salts that contain the dopant atoms and that dissociate in solution to provide dopant ions for incorporation into the nanowires. Thus, chloride-containing salts can be used to form chloride-doped zinc oxide nanowires and fluoride-containing salts can be used to form fluoride-doped zinc oxide nanowires. Examples of suitable chloride-containing precursor salts include aluminum chloride ($AlCl_3$), zinc chloride ($ZnCl_2$), potassium chloride (KCl) and ammonium chloride ($NH_4Cl$).

Suitable fluoride-containing precursors are soluble and stable fluoride salts that provide free fluoride ions, and contain acidic or benign counter anions. (As used herein, acidic refers to those that are slightly hydrolysable, such as $NH^{4+}$, $Al^{3+}$ and the like. Benign refers to potassium ions, sodium ions, and the like, which don't hydrolyze and, thus, are not acidic.) Examples include: $AlF_3$, $ZnF_2$, $NH_4F$, KF, $NaF$, $BaF_2$, and $AgF$.

The pH buffering agent may be used alone or in combination with one or more acids to provide a buffering system that maintains the pH of the aqueous solution in the desired range. Generally, the additional acids are used in combination with dopant-containing precursor salts that are non-acidic or only weakly acidic. The additional acids may be unnecessary for more acidic dopant-containing precursor salts, such as aluminum chloride. By way of illustration, hexamethylenetetramine (HMTA) is an example of a pH buffering agent that can be included in the aqueous nanowire growth solutions and acetic acid is an example of an organic acid that can be included in the aqueous nanowire growth solutions. Other suitable buffering agents include, but are not limited to, $NH_3H_2O$ (ammonia). Other suitable additional weak acids include, but are not limited to, phosphoric acid ($H_3PO_4$) and citric acid ($C_6H_8O_7$).

The zinc-containing precursor salts are salts that contain zinc atoms that dissociate in solution to provide zinc for incorporation into the nanowires. Zinc nitrate ($Zn(NO_3)_3$) and $ZnCl_2$ are examples of suitable zinc-containing precursor salts.

The zinc nanowires are grown from the aqueous solution in the presence of a substrate having catalyst seed crystals disposed on one or more of its surfaces. Suitable seed crystals include ZnO crystals, ZnS crystals and GaN crystals. The substrate can be made of a wide variety of materials including dielectric materials and electrically conductive materials. The substrate can comprise, for example, a polymer, a metal, a metal alloy, a semiconductor, a glass or a ceramic. The density of the nanowires grown from a substrate will depend, at least in part, on the density of seed crystals. Thus, a discontinuous film characterized by a low density of nanowires can be grown from a substrate comprising a low density of seed crystals, while a continuous film of nanowires can be grown for a substrate comprising a high density of seed crystals.

The temperature of the aqueous nanowire growth solution is desirably maintained below the boiling point of the solution (e.g., at a temperature ≤100° C.). In some embodiments of the methods, the aqueous solution is maintained at a temperature in the range from about 80° C. to about 98° C.

Nanowires grown in accordance with the present methods are highly elongated structures characterized by nanoscale diameters. That is, they typically have diameters of no greater than about 500 nm (e.g., ≤200 nm) and lengths of greater than 1 μm (e.g., ≥2 μm). The dopant concentration in the nanowires will depend on the concentration of dopant-containing precursor salt in the solution and the nature of said salt. In some embodiments, the present methods provide zinc oxide nanowires having a dopant concentration of at least 0.1 atomic %. This includes nanowires having a dopant concentration of at least 0.2 atomic %, at least 1 atomic %, or at least 2 atomic %.

EXAMPLES

Example 1

This example illustrates the synthesis of chloride-doped ZnO nanowires and their use as photoelectrochemical electrodes.

Figure 1:
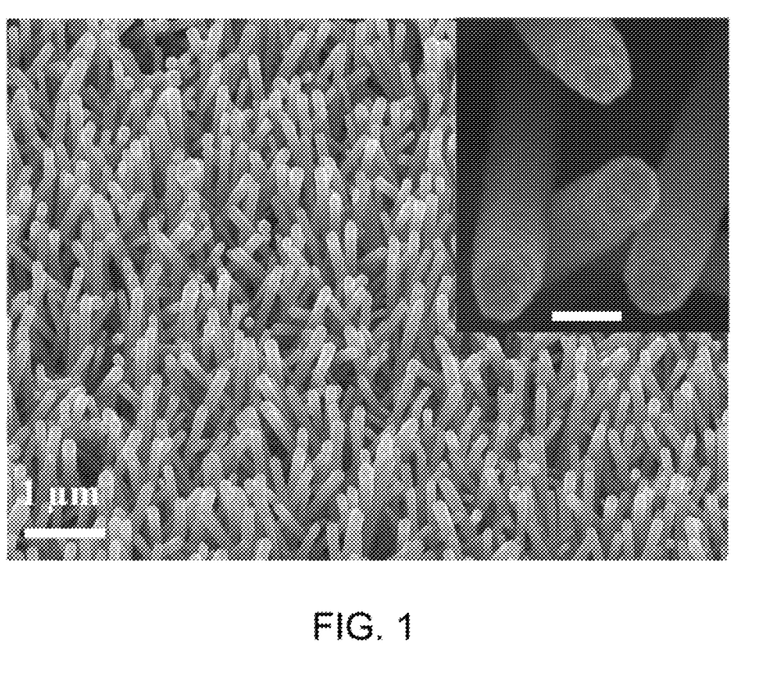
FIG. 1 is an SEM image of a Cl-doped ZnO NW array. The inset is a zoomed-in SEM image exhibiting the rough tips and surfaces of Cl-doped ZnO NWs. The scale bar in the inset is 100 nm.
Figure 2:
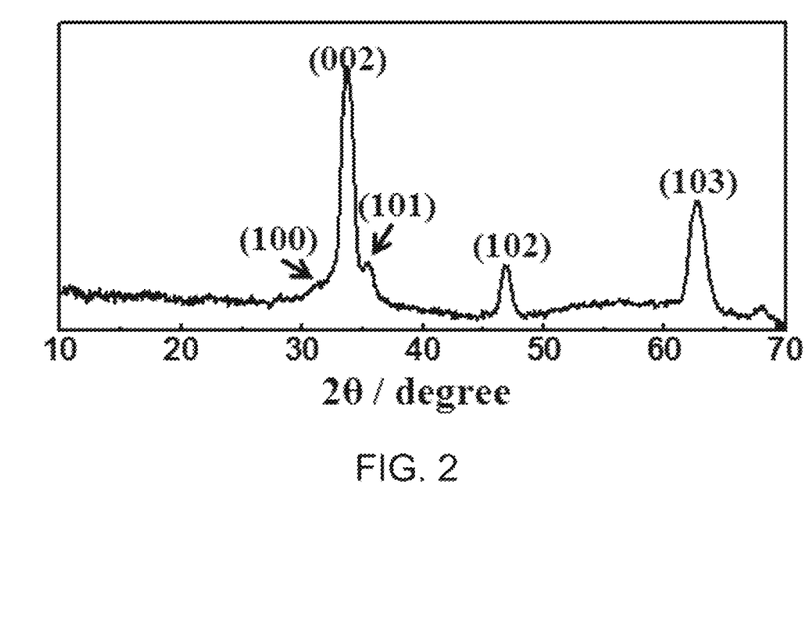
FIG. 2 shows the powder X-ray diffraction pattern of an as-grown Cl-doped ZnO NW array. All peaks could be assigned to wurtzite ZnO.

In the synthesis, 2.5 mM $AlCl_3$ was used in addition to 25 mM $Zn(NO_3)_3$ and hexamethylenetetramine (HMTA) and the growth was conducted, in a glass vial at 90° C. in an oven. FIG. 1 is a scanning electron microscopy (SEM) image of the doped ZnO NWs. They exhibited a partially vertical alignment and fairly uniform sizes (2 to 4 μm in length, ~100 nm in diameter). This morphology was very similar to typical un-doped ZnO NWs grown under the same concentration. High-magnification SEM images (inset of FIG. 1) revealed laddered side surfaces and discretely tapered NW tips which are not typically seen in un-doped ZnO NWs. The rough surfaces may be a result of surface modifications by Al ions. In control experiments in which KCl was used as the doping source and Cl was successfully doped, the resulting ZnO NWs had very flat surfaces. FIG. 2 is the X-ray diffraction (XRD) pattern of the Cl-doped ZnO NW arrays. All peaks could be indexed to wurtzite ZnO and no impurity phases could be discerned.

Figure 3:
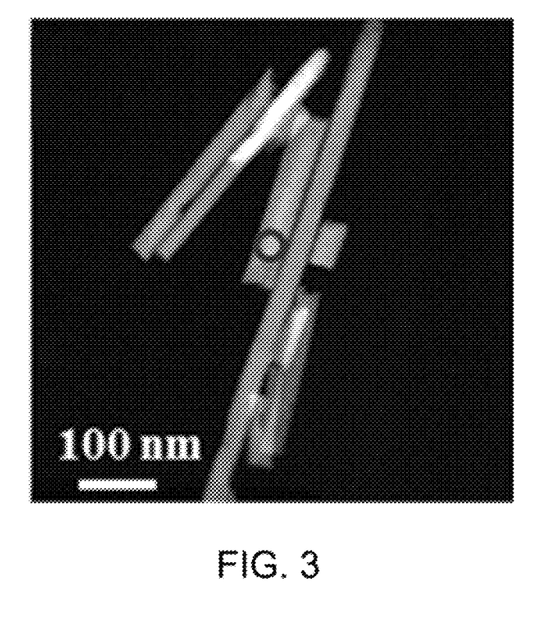
FIG. 3 is a low magnification dark field STEM image of as-synthesized Cl-doped ZnO NWs.
Figure 4:
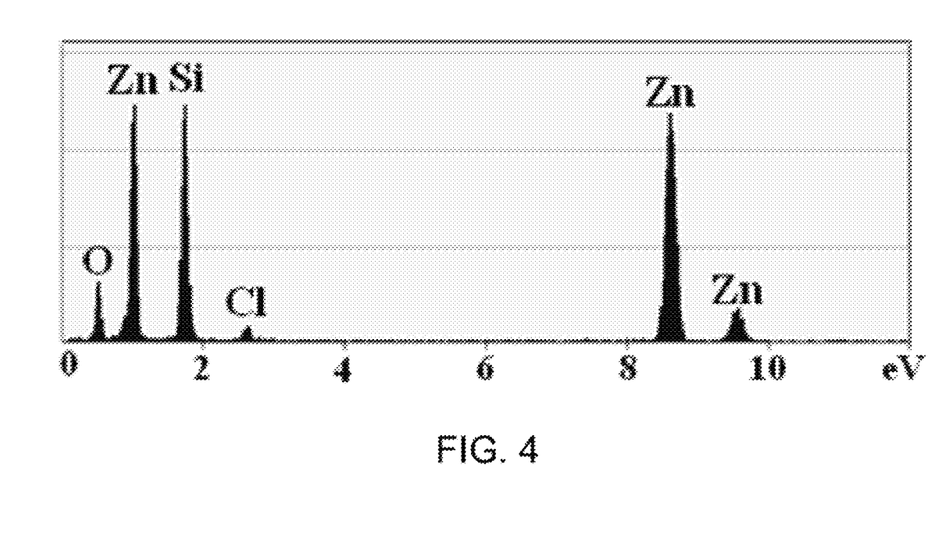
FIG. 4 shows the EDX spectrum of the circled area in FIG. 3.
Figure 5:
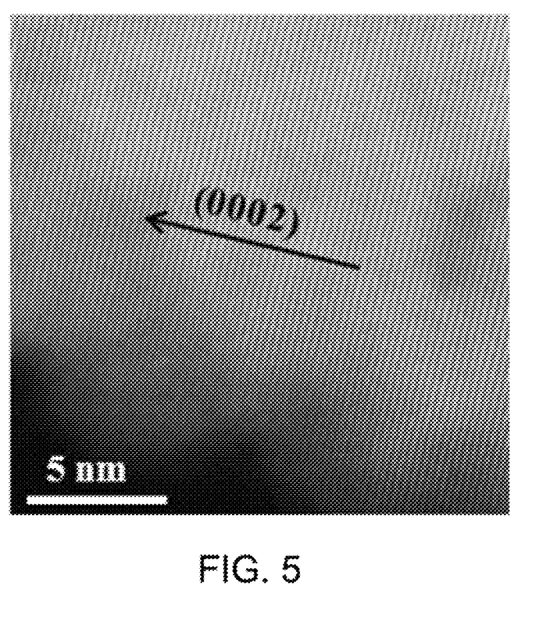
FIG. 5 is a high-resolution STEM image taken along the side surface of a Cl-doped ZnO NW.

Aberration-corrected scanning transmission electron microscopy (STEM) was used to investigate the identity of the dopant, as well as the defect type associated with the dopant. Atomic-resolution high angle annular dark field (HAADF) STEM was used to image the ZnO crystal lattice. The TEM sample was cleaned by oxygen plasma prior to imaging. FIG. 3 shows a few doped ZnO NWs, where the uniform diameter can be observed. Energy-dispersive X-ray spectroscopy (EDX) acquired from the circled spot in FIG. 3 gave a strong signal of Cl, in addition to those peaks from ZnO and the Si membrane (FIG. 4), evidencing the existence of Cl. A number of spots were surveyed and the corresponding EDX spectra all gave conspicuous Cl peaks without any Al signal. In high-resolution electron energy loss spectroscopy (EELS) (FIG. 7), no trace of Al was found. Therefore, it was concluded that these ZnO NWs were Cl-doped and excluded any co-doping with Al. FIG. 5 is a high-resolution STEM image confirming the single-crystalline nature of the NWs. No amorphous layer could be observed on the surface. The entire NW had a fairly rough surface including the side surfaces (FIG. 5).

A number of control experiments were run to investigate the doping mechanism of Cl and the role that Al played during the doping. $AlCl_3$ was replaced with other soluble chlorides, including $ZnCl_2$, KCl and $NH_4Cl$ to see if Cl was solely responsible for the doping. EDX spectra of the resulting products obtained from an EDX detector equipped in an SEM chamber didn't show any discernible Cl signals. However, after adding 2.5 mM acetic acid (HOAc) along with these chloride salts, a Cl signal could be readily identified. When using a high resolution EDX detector in STEM, the Cl signal could be detected in all of the samples, although the atomic weight of Cl in those samples with HOAc were all higher than those without HOAc added (about 0.6% versos about 0.2%). Therefore, it was concluded that Cl ions alone could lead to at least a small amount of Cl doping. In un-doped ZnO NW growth, zinc hydroxyl ions ($Zn(OH)_{2+x}^{-x}$) diffuse to the growing surfaces of the ZnO NWs prior to the dehydration of $OH^-$ ions. When $Cl^-$ ions are present, zinc hydroxyl chloride species ($Zn(OH)_xCl_y^{-(x+y-2)}$) can be formed and diffuse to the growing surfaces of the ZnO NWs. When the leaving group is OH⁻ and Cl⁻ remain on the growing ZnO NW surface and get buried by upcoming ZnO host materials, a substitutional Cl is doped in the ZnO NW lattice. This doping model dictates that the doping concentration is dependent on the concentration of zinc hydroxyl chloride species, which explains the effect of the addition of HOAc.

The pH of the growth solution of un-doped ZnO NW can be controlled by HMTA. When HOAc is present, it works together with HMTA and buffers the solution to a slightly more acidic region. Therefore, the concentration of OH⁻ ions decreases, which promotes the formation of zinc hydroxyl chloride species over pure zinc hydroxyl species. Experimentally, the pH values of the growth solution of un-doped ZnO NWs, as well as Cl-doped ZnO NWs without HOAc added, were all measured to be around 5.65, while the pH value of those with HOAc added were around 5.55. Another way of promoting Cl doping other than lowering the pH value is to use a higher concentration of Cl⁻ ions. An experiment in which 25 mM KCl was added produced a significantly higher Cl signal in the EDX.

Although Cl⁻ ions alone can lead to Cl doping, $Al^{3+}$ ions may catalyze the reaction between zinc hydroxyl chloride species and the growing ZnO surfaces. This is evidenced from the fact that none of the other doping precursors yielded a doping concentration as high as $AlCl_3$ (2% for $AlCl_3$ versus 0.2% for other chloride salts).

Figure 6:
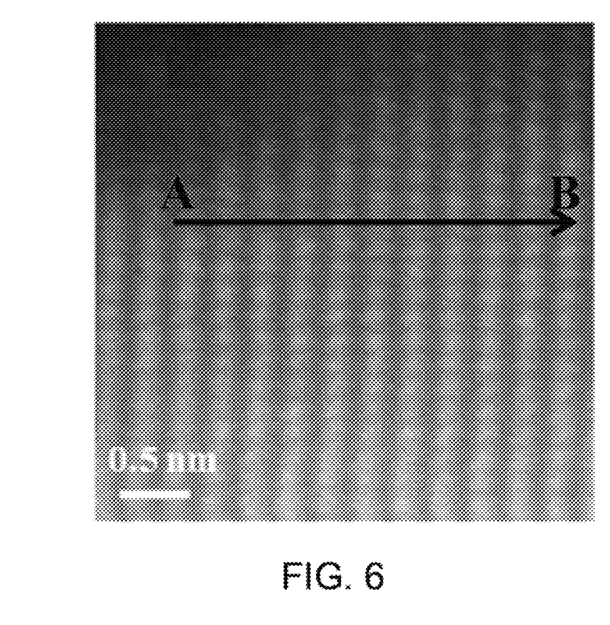
FIG. 6 is a high-resolution STEM image of the area where atomic-resolution EELS line profiles were acquired.
Figure 7:
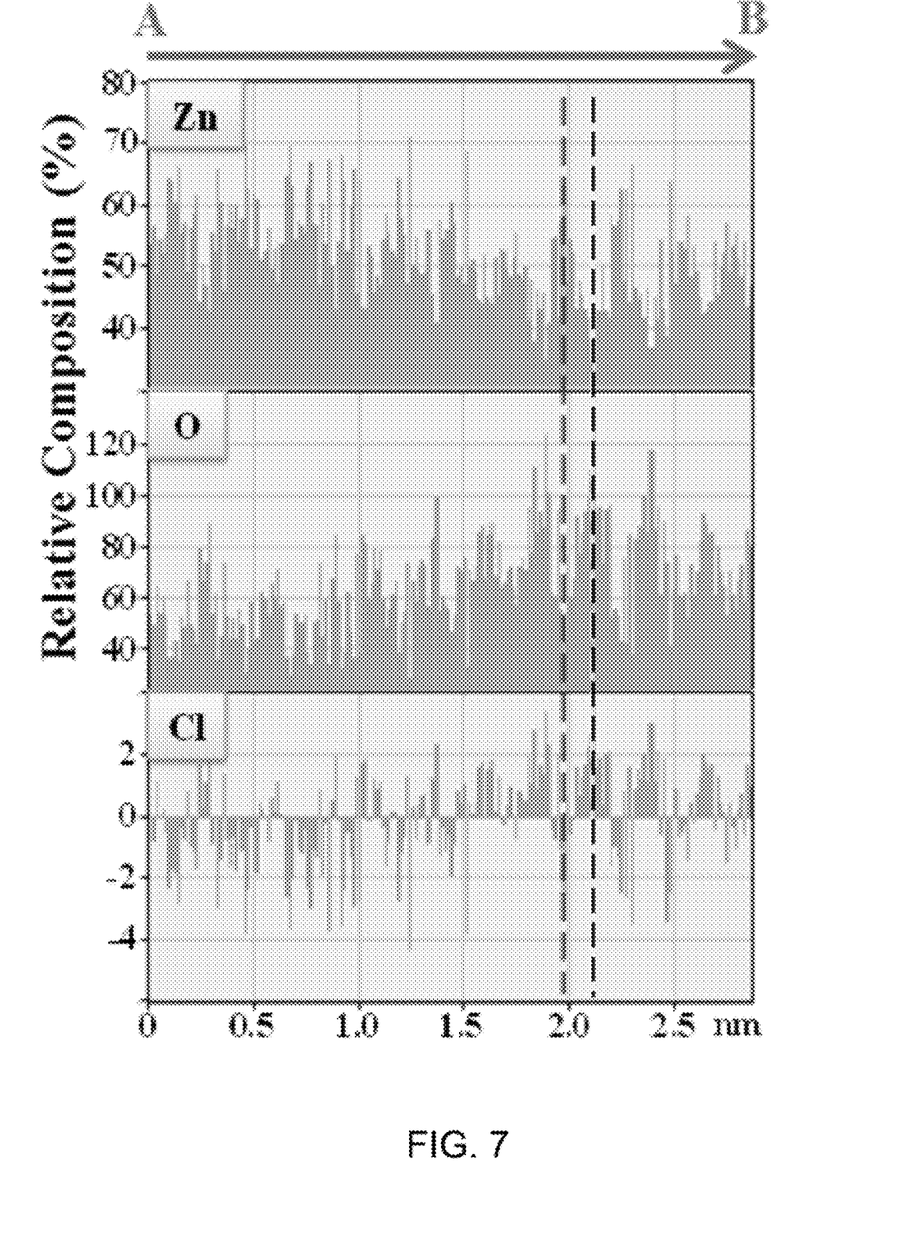
FIG. 7 shows the EELS line profiles of Zn, O, and Cl along the line in FIG. 6 labeled from A to B. The left-most dashed line marks the position of a zinc column in FIG. 6 and the right-most dashed line marks the position where an O with substitutional Cl column resides.

High-resolution EELS was performed on a NW to identify the characteristics of Cl-doping. FIG. 6 is a dark field STEM image where the bright spots are Zn columns (O columns could not be resolved from the image). EELS line profiles of Zn, O, and Cl were acquired from points A to B. The intensity peaks represent where the atom columns of interest were located (FIG. 7). Comparing the Zn profile to the O profile, it was found that the Zn and O columns appeared alternatively along the [002] scanning line. This is consistent with the Wurtzite structure and validates the EELS analysis. While examining Cl profiles, it was found that the Cl signals precisely overlapped with the O positions and were absent at the Zn positions. This leads to the conclusion that Cl atoms exclusively substitute O atoms.

Figure 8:
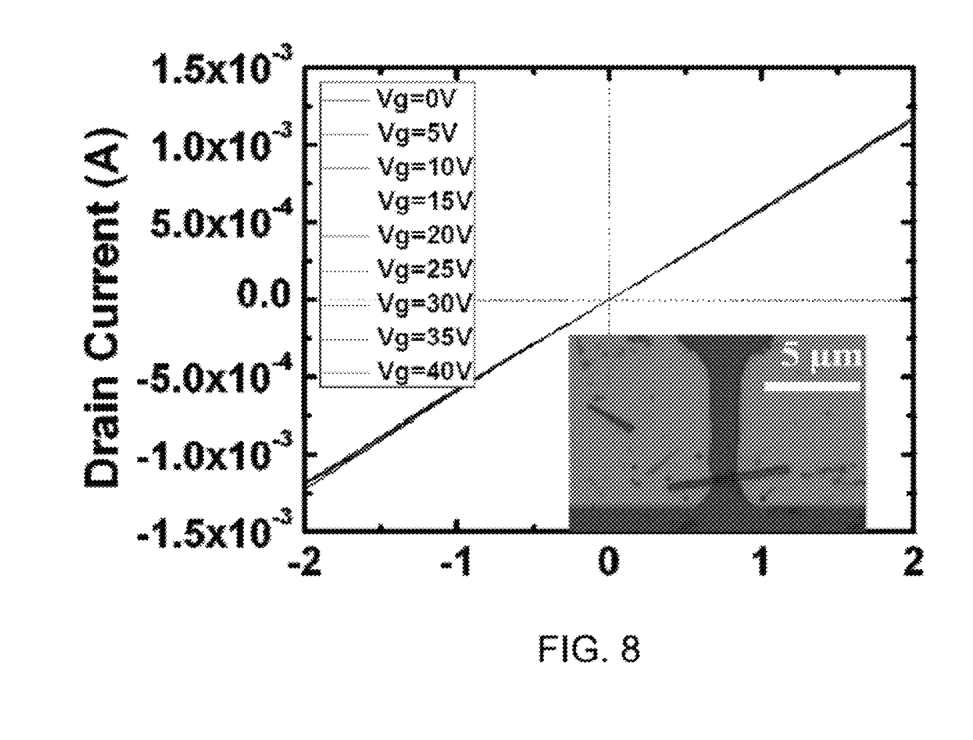
FIG. 8 is a graph of the source-drain currents of Cl-doped NW in a single-NW FET set-up at different gate voltages. Inset is an optical microscopy image of the FET device.
Figure 9:
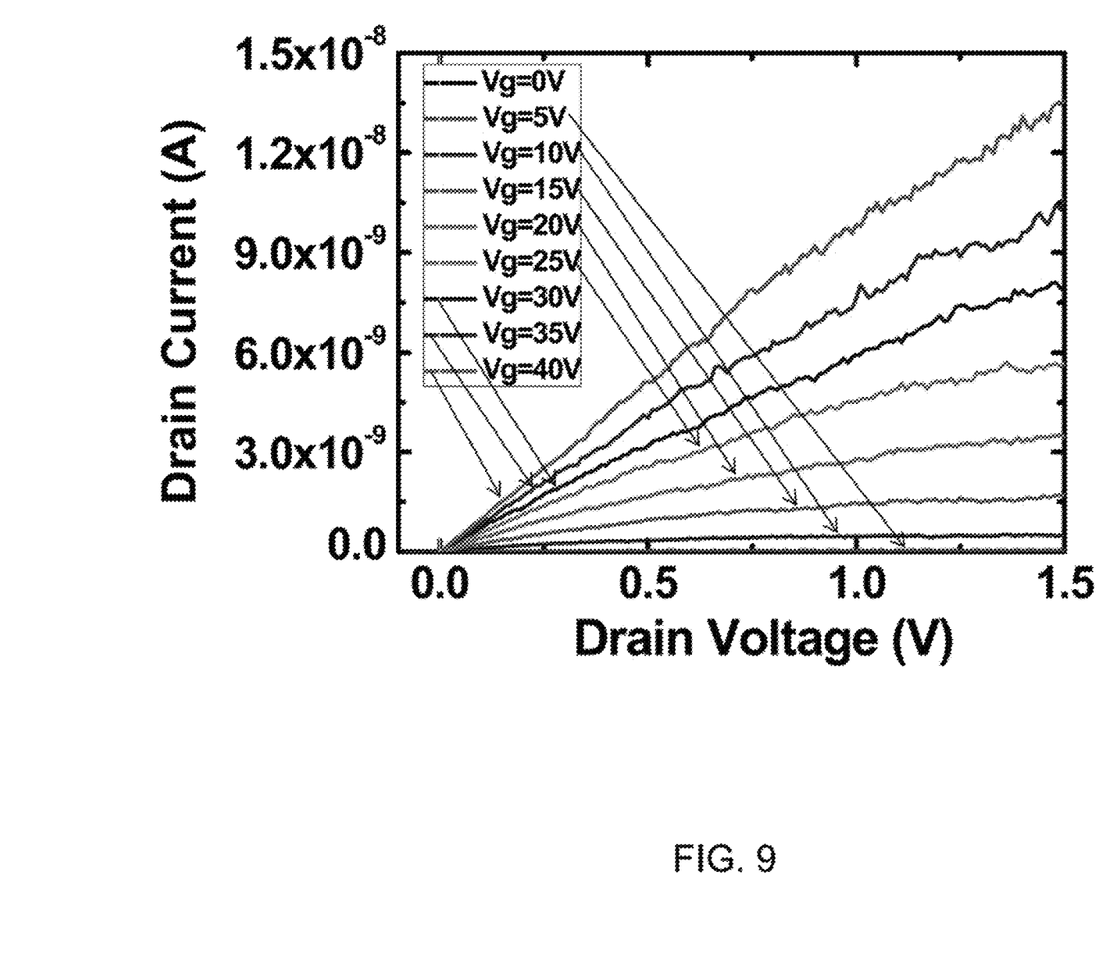
FIG. 9 is a graph of the source-drain currents of un-doped ZnO NW in a single-NW FET set-up showing a typical n-type behavior with higher source-drain currents at higher gate voltages.

Single-NW field-effect transistors (FET) were fabricated using both Cl-doped and un-doped ZnO NWs to investigate their electron transport properties. The inset of FIG. 8 is an optical microscopy image of a typical NW-FET device. The I-V curves of the Cl-doped NW exhibited a metallic conductivity without any field effect, that is, the conductivity remained constant at different gate voltages (FIG. 8); whilst un-doped NW exhibited a typical n-type semiconductor behavior (FIG. 9). Compared to the un-doped ZnO NW, the conductivity of the Cl-doped. ZnO NW was increased by five orders of magnitude. Given the dimensions of the NW, the resistivity of Cl-doped ZnO NW was calculated to be approximately $2\times10^{-5}$ Ω·m. The resistivities of a number of Cl-doped NWs were measured, all of which gave comparable resistivity. The resistivity of un-doped NWs varied a lot, and the best-performing NW gave a resistivity of $1\times10^{-2}$ Ω·m.

The influence of Cl-doping on the ZnO band structure was assessed by UV-visible light absorption measurements. The absorption spectra of both Cl-doped and un-doped ZnO NWs exhibited strong band gap absorption at 380 nm, corresponding to an optical band gap of 3.26 eV. In heavily doped n-type semiconductors, electrons from the valance band have to transit vertically to electron states higher than those occupied by donor electrons near the conduction band edge. This results in optical band gap widening and is referred to as the Burstein-Moss band filling effect. On the other hand, at doping concentration above the critical Mott value, the hybridization between impurity level and host electron states (referred to as band gap renormalization) results in band gap narrowing. These two effects in the present heavily Cl-doped ZnO NWs may be equal in power. Other than band gap absorption, no other absorption peaks were observed. The featureless absorption in the visible range was due to light scattering from distributed NW powders rather than absorption. This study revealed that Cl-doped ZnO remained transparent in the visible light regime.

Figure 10:
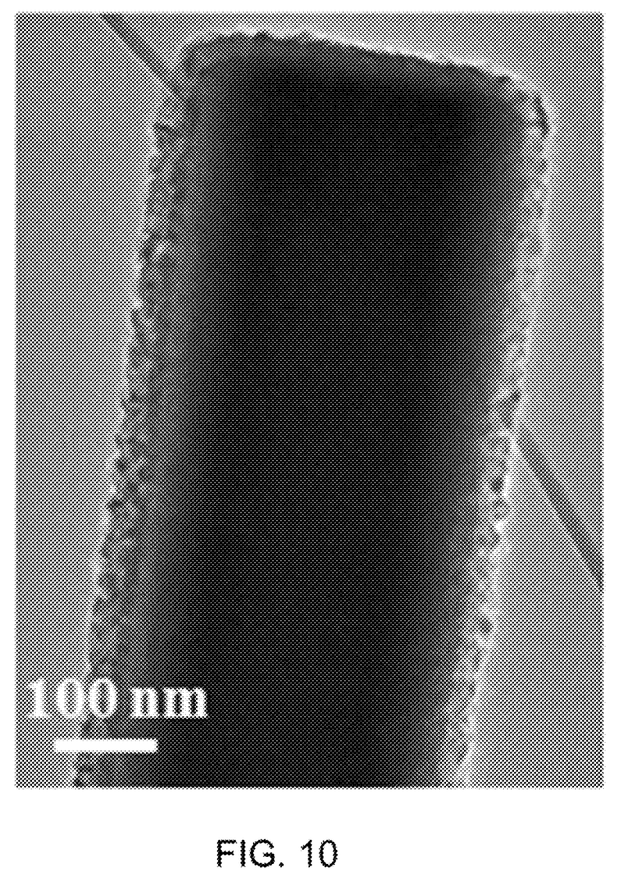
FIG. 10 is a bright-field TEM image showing a Cl-doped ZnO NW completely coated with polycrystalline anatase $TiO_2$.
Figure 11:
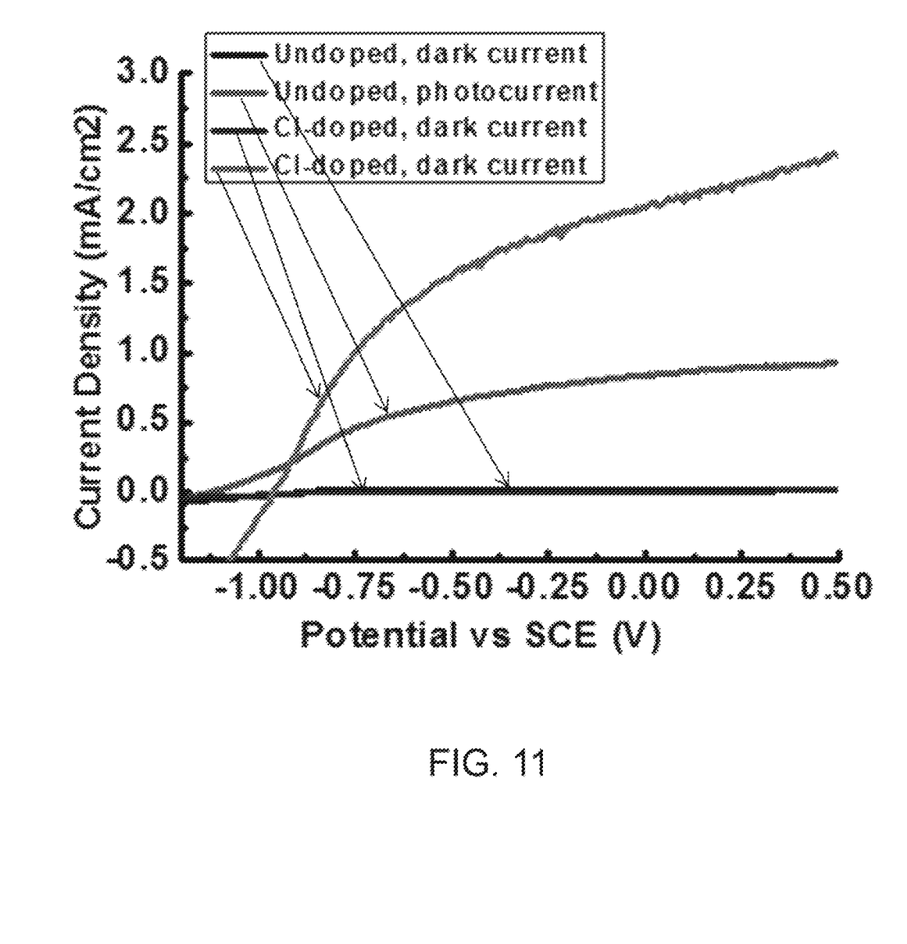
FIG. 11 is a graph of the photocurrent and dark current of two PEC photoanodes based on un-doped and Cl-doped NW arrays.
Figure 12:
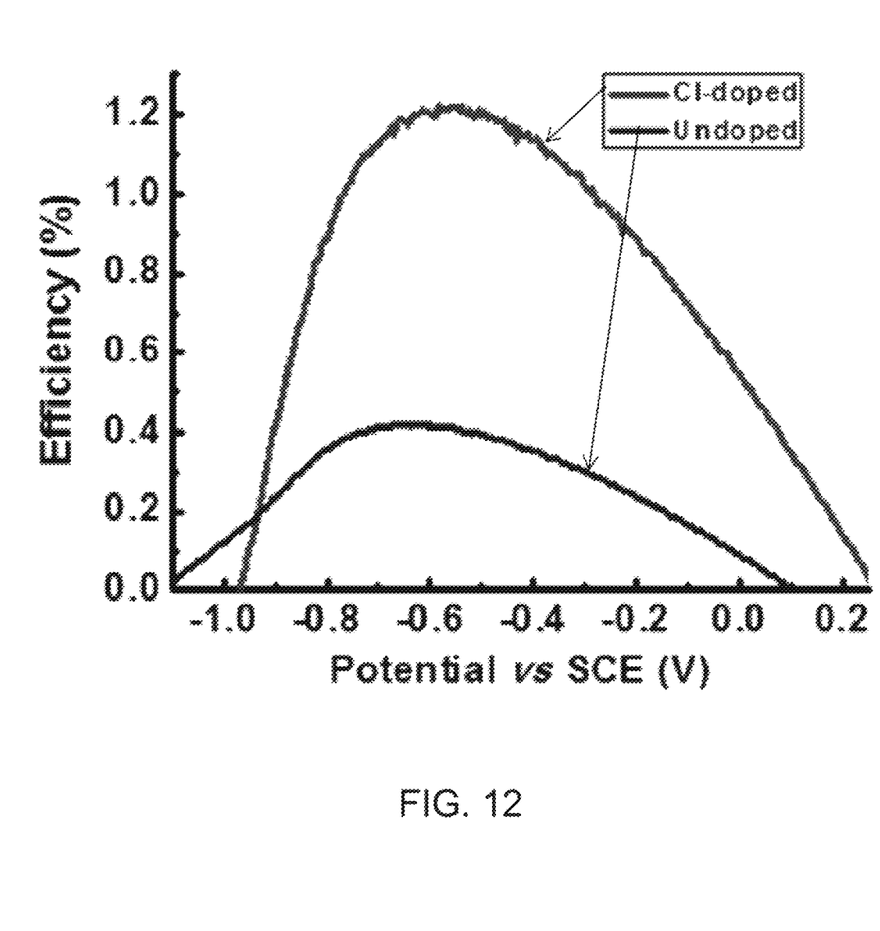
FIG. 12 is a graph of the PEC efficiencies of the two devices of FIG. 11 versus applied bias.

To illustrate the application potential of the metallic Cl-doped NWs, PEC photoanodes were fabricated using both undoped and Cl-doped ZnO NW arrays coated with a $TiO_2$ film that was applied using atomic layer deposition (ALD). The NWs were ~10 micrometer long and grown on FTO substrates. FIG. 10 is a TEM image of a Cl-doped ZnO NW coated uniformly with a $TiO_2$ layer, without any exposed ZnO areas. The $TiO_2$ layer was polycrystalline anatase with a thickness varying between 20 nm to 25 nm, covering the entire ZnO NW surfaces, including the tips and side surfaces. In this PEC anode configuration, the electron-hole pairs are generated by photo illumination in both ZnO and $TiO_2$. The holes are used to oxidize hydroxide groups in 1 M KOH electrolyte while the electrons are conducted by the ZnO NW to the FTO substrate, and then conducted to the Pt counter electrode for hydrogen production. The dark current density and photocurrent density versus applied bias were measured using an Autolab potentiostat under 100 $mM/cm^2$ illumination from a Xe lamp. In FIG. 11, the dark currents of both un-doped and Cl-doped ZnO NW-based devices were fairly low and flat over the voltage range. The photocurrent density of the Cl-doped ZnO NW photoanode was 2.0 $mA/cm^2$ at zero bias, which was more than twice as much as that of the un-doped ZnO NW photoanode. Given the light absorption of Cl-doped ZnO doesn't differ much from un-doped ZnO, as discussed above, this increased photocurrent can be attributed to the enhanced electron conductivity of ZnO NWs by Cl-doping, which has resulted in faster electron collection and mitigated recombination. The calculated PEC efficiency for both devices is plotted in FIG. 12. The higher photocurrent density from the Cl-doped NW-based device gave rise to a higher PEC efficiency of up to 1.2% at −0.61 V, relative to saturated calomel electrode (SCE), whereas the efficiency of un-doped NW-based photoanode was 0.4%, representing only a third of the value above.

Example 2

This example illustrates the synthesis of a dense film comprising a plurality of chloride-doped ZnO nanowires.

Figure 13:
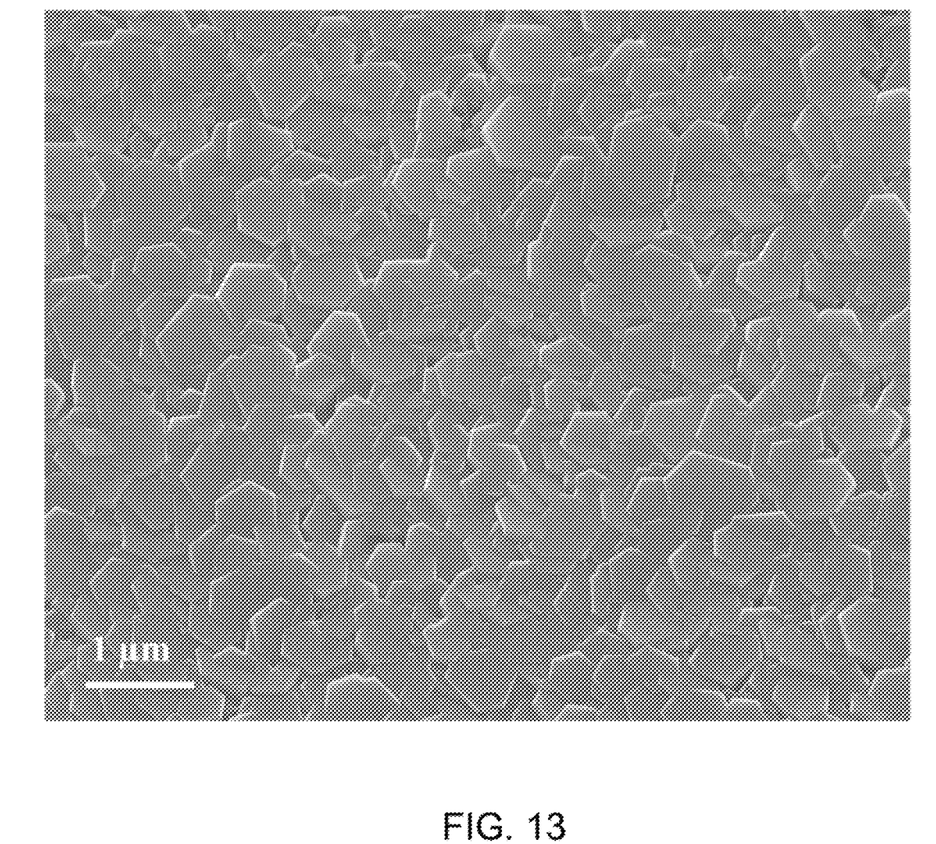
FIG. 13 is an SEM image of the Cl-doped nanowire film of Example 2.

A Cl-doped ZnO nanowire film was grown using the method described above in Example 1, but with a much higher precursor concentration. For this example, the growth solution was 0.10 M $Zn(NO_3)_2$, 0.10 M HMTA, and 0.10 M KCl. The seeding procedure was the same as that of growing Cl-doped ZnO nanowires of Example 1. The substrate was placed in a glass vial that contained the above-mentioned solution. The growth was carried at 90° C. for about 5 hours. The higher concentration of the precursors and the choice of KCl as the Cl source led to the formation of much thicker nanowires, which eventually merged into a continuous film, as shown in the SEM image of FIG. 13.

This approach can be applied to grow conductive ZnO TCO films on a wide variety of substrates, including glass, silicon, plastic, and fabric substrates.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of making conductive, doped zinc oxide nanowires, the method comprising:
    forming an aqueous solution comprising a chloride-containing or fluoride-containing precursor salt, a zinc-containing precursor salt and a pH buffeting agent; and
    heating the aqueous solution to a reaction temperature below its boiling point in the presence of a substrate comprising seed crystals, wherein the aqueous solution has a pH in the range from about 5 to about 7 at the reaction temperature;
    whereby chloride- or fluoride-doped zinc oxide nanowires are grown in situ from the seed crystals in the aqueous solution.

2. The method of claim 1, wherein the aqueous solution has a pH in the range from about 5.3 to about 6 at the reaction temperature.

3. The method of claim 1, wherein the substrate is a non-electrically conducting substrate.

4. The method of claim 1, wherein the aqueous solution further comprises an acid that, together with the pH buffering agent, provides the pH in the range from about 5 to about 7 at the reaction temperature.

5. The method of claim 4, wherein the acid comprises one or more of acetic acid, phosphoric acid, and citric acid.

6. The method of claim 1, wherein the chloride dopant concentration or fluoride dopant concentration in the doped zinc oxide nanowires is at least 0.1 atomic %.

7. The method of claim 6, wherein the chloride dopant concentration or fluoride dopant concentration in the doped zinc oxide nanowires is in the range from about 0.2 atomic % to about 2 atomic %.

8. The method of claim 1, wherein the aqueous solution comprises the chloride-containing precursor salt.

9. The method of claim 8, wherein the chloride-containing precursor salt is aluminum chloride.

10. The method of claim 9, wherein the doped zinc oxide nanowires have a chloride dopant concentration of at least about 1 atomic %.

11. The method of claim 9, wherein the zinc-containing precursor salt is zinc nitrate.

12. The method of claim 11, wherein the substrate is a non-electrically conducting substrate and the reaction temperature is in the range from about 80 to about 98° C.

13. The method of claim 8, wherein the aqueous solution further comprises an acid that, together with the pH buffering agent, provides the pH in the range from about 5 to about 7 at the reaction temperature and further wherein the aqueous solution comprises a chloride-containing precursor salt selected from ammonium chloride, zinc chloride or potassium chloride.

14. The method of claim 13, wherein the chloride-containing precursor salt is zinc chloride or potassium chloride.

15. The method of claim 8, wherein the doped nanowires have a chloride dopant concentration of at least about 0.1 atomic %.

16. The method of claim 8, wherein the zinc-containing precursor salt is zinc nitrate.

17. The method of claim 8, wherein the substrate is a non-electrically conducting substrate.

18. The method of claim 1, wherein the aqueous solution comprises the fluoride-containing precursor salt.

19. The method of claim 18, wherein the fluoride-containing precursor salt is sodium fluoride.

20. The method of claim 1, wherein the aqueous solution has a pH in the range from about 5 to about 5.7 at the reaction temperature.

* * * * *